US012562347B2

(12) United States Patent
Chen et al.

(10) Patent No.: US 12,562,347 B2
(45) Date of Patent: *Feb. 24, 2026

(54) CONNECT STRUCTURE FOR SEMICONDUCTOR PROCESSING EQUIPMENT

(71) Applicant: Taiwan Semiconductor Manufacturing Company Limited, Hsin-Chu (TW)

(72) Inventors: Ming-Sze Chen, Hsinchu (TW); Hung-Chih Wang, Taichung (TW); Yuan-Hsin Chi, Taichung County (TW); Sheng-Yuan Lin, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/757,710

(22) Filed: Jun. 28, 2024

(65) Prior Publication Data

US 2024/0355591 A1 Oct. 24, 2024

Related U.S. Application Data

(63) Continuation of application No. 17/866,640, filed on Jul. 18, 2022, now Pat. No. 12,040,163.

(51) Int. Cl.

| | |
|---|---|
| *F16L 13/14* | (2006.01) |
| *F16L 33/207* | (2006.01) |
| *H01J 37/32* | (2006.01) |
| *F16L 33/22* | (2006.01) |

(52) U.S. Cl.
CPC ........ *H01J 37/32522* (2013.01); *F16L 13/14* (2013.01); *H01J 37/32513* (2013.01); *F16L 33/2073* (2013.01); *F16L 33/223* (2013.01); *H01J 37/32807* (2013.01); *H01J 37/3288* (2013.01)

(58) Field of Classification Search
CPC ......... F16L 13/14; F16L 13/146; F16L 33/24; F16L 33/223; F16L 33/20; F16L 33/225; F16L 33/226; F16L 33/207; F16L 33/2071; F16L 33/2073
See application file for complete search history.

(56) References Cited

U.S. PATENT DOCUMENTS

| | | | | |
|---|---|---|---|---|
| 1,006,671 A * | 10/1911 | Myer | .................... | F16L 33/223 |
| 1,233,401 A * | 7/1917 | Reeve | .................. | F16L 33/223 |
| 2,371,971 A * | 3/1945 | Main | ....................... | F16L 33/24 |
| 2,513,115 A * | 6/1950 | Sprigg | | |
| 3,684,319 A * | 8/1972 | Samartina | ............. | F16L 33/223 |
| 2007/0052231 A1* | 3/2007 | Li | .......................... | F16L 33/223 |
| 2022/0275892 A1* | 9/2022 | Sherman | ............... | F16L 33/226 |

* cited by examiner

*Primary Examiner* — William S. Choi
(74) *Attorney, Agent, or Firm* — Cooper Legal Group, LLC

(57) ABSTRACT

A connect structure for semiconductor processing equipment includes a housing configured to mate a deformable pipe with a non-deformable pipe. The housing includes a first annular sidewall to receive the deformable pipe and a second annular sidewall defining a first thread structure. An annular bead is connected to the first annular sidewall to flexibly deform the deformable pipe toward the non-deformable pipe structure when the first thread structure rotatably engages a second thread structure of the non-deformable pipe.

20 Claims, 7 Drawing Sheets

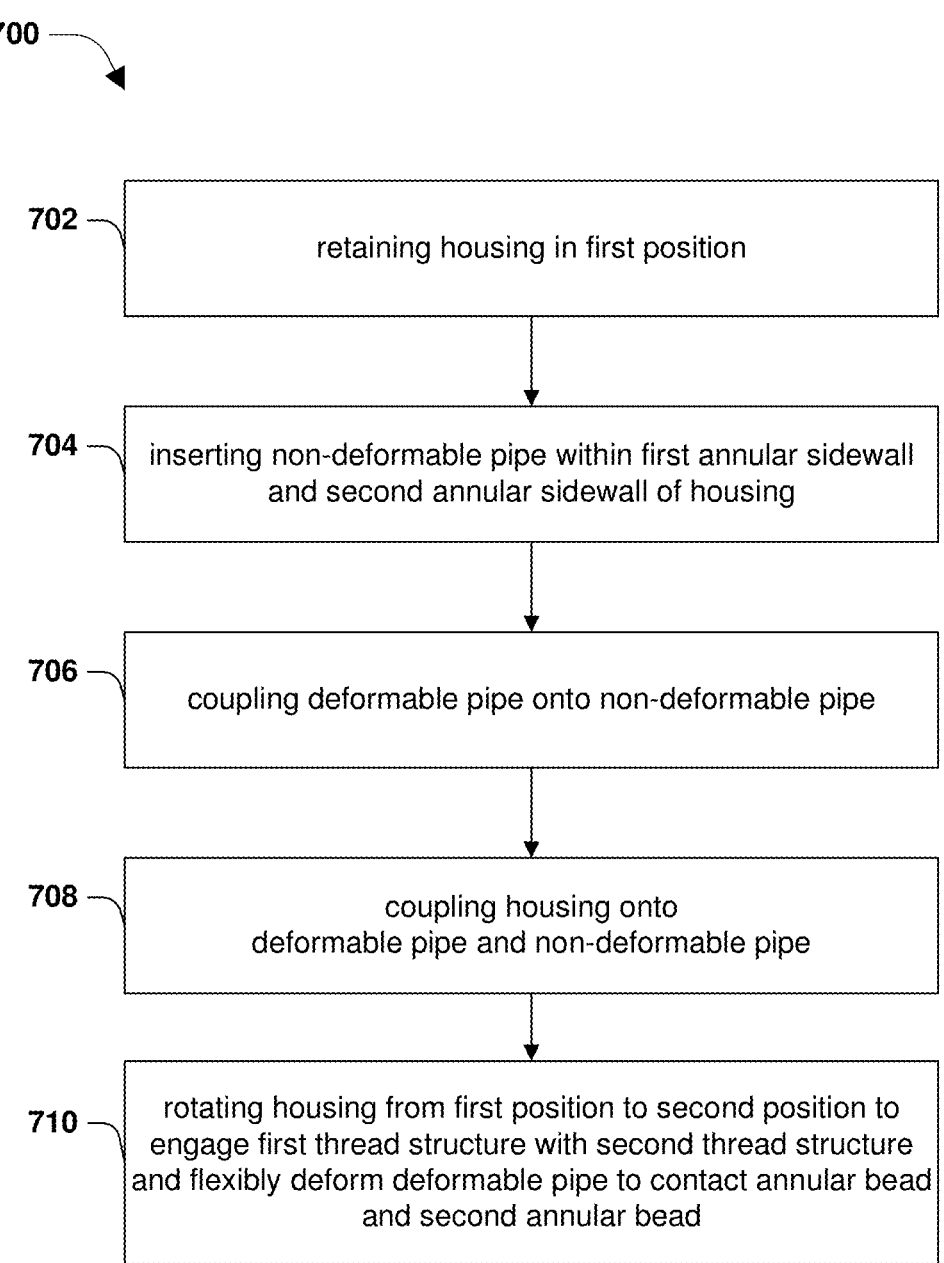

700

702 — retaining housing in first position

704 — inserting non-deformable pipe within first annular sidewall and second annular sidewall of housing 706 — coupling deformable pipe onto non-deformable pipe 708 — coupling housing onto deformable pipe and non-deformable pipe 710 — rotating housing from first position to second position to engage first thread structure with second thread structure and flexibly deform deformable pipe to contact annular bead and second annular bead

FIG. 7

CONNECT STRUCTURE FOR SEMICONDUCTOR PROCESSING EQUIPMENT

RELATED APPLICATION

This application is a continuation of U.S. patent application Ser. No. 17/866,640, titled "CONNECT STRUCTURE FOR SEMICONDUCTOR PROCESSING EQUIPMENT" and filed Jul. 18, 2022, which is incorporated herein by reference.

BACKGROUND

Semiconductor processing equipment utilizes one or more process chambers in the fabrication of integrated circuits onto semiconductor wafers. For example, a wafer may be processed in a chamber that is supplied with a reactive gas, such as a plasma gas, to react with a surface of the wafer and/or one or more layers formed on the wafer. Semiconductor processing equipment, such as plasma generation equipment and related components, is generally cooled through a matrix of liquid cooling components that are routinely assembled and reconfigured to perform various operations associated with semiconductor fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 illustrates a method, according to some embodiments.

DETAILED DESCRIPTION

Figure 1:
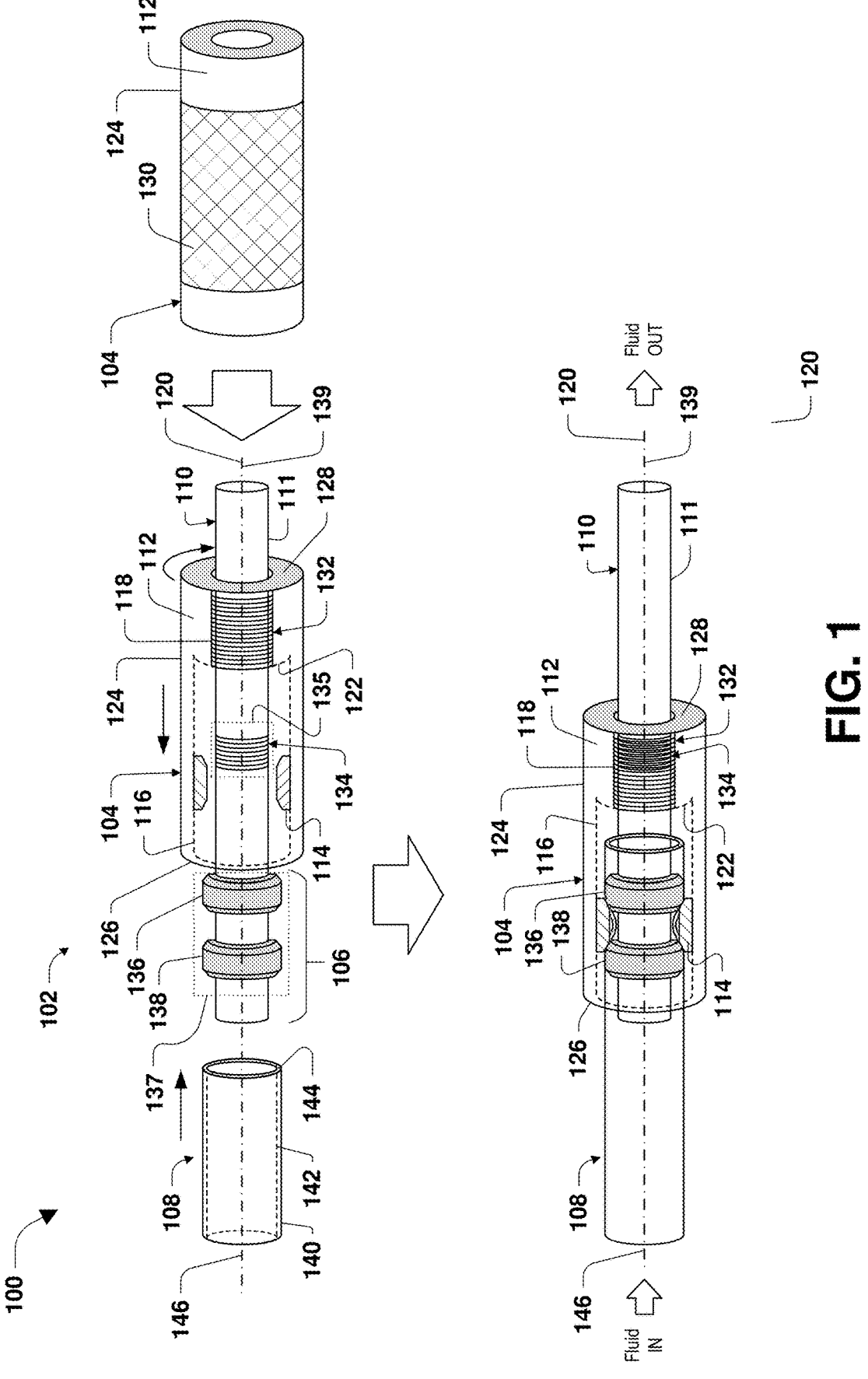
FIG. 1 illustrates a perspective view of an implementation of fluid communication in semiconductor processing equipment, according to some embodiments.

The following disclosure provides several different embodiments, or examples, for implementing different features of the provided subject matter with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and the like, may be used herein to describe both direct and indirect relationships. "Directly" connected, adjacent, or coupled may refer to a relationship in which there are no intervening components, devices, or structures. "Indirectly" connected, adjacent, or coupled may refer to a relationship in which there are intervening components, devices, or structures.

Semiconductor processing equipment, such as plasma generation equipment and related components, may be cooled through a matrix of liquid cooling components that are assembled and reconfigured to perform various operations associated with semiconductor fabrication. The liquid cooling components communicate fluids, such as water, through non-deformable pipes, such as metal pipes. The liquid cooling components may include cooling coils that mitigate heat generation from components of the semiconductor processing equipment. For example, plasma generation equipment may include a plurality of RF antennas to direct plasma energy toward a stage supporting a semiconductor wafer. Each of the RF antennas and/or the stage may include a cooling coil, such as a non-deformable pipe, that is connected to a deformable pipe for fluid communication with other semiconductor process equipment, such as a heat exchanger. Traditional fluid connections generally include a flexible metal band, encircling a union of the deformable pipe and the non-deformable pipe, which is tightened with tools. The semiconductor processing equipment is routinely assembled, disassembled, and/or reconfigured to perform various operations associated with semiconductor fabrication, such as scheduled maintenance and fluid exchange. Traditional fluid connections using tools are time consuming and present delays in semiconductor fabrication.

In some embodiments, a connect structure for semiconductor processing equipment is provided. In some embodiments, the connect structure facilitates coupling of a deformable pipe and a non-deformable pipe without the use of tools. The connect structure may include a housing configured to mate a deformable pipe associated with the semiconductor processing equipment with a non-deformable pipe structure associated with the semiconductor processing equipment. The housing includes a first annular sidewall to receive the deformable pipe and a second annular sidewall connected to the first annular sidewall. The second annular sidewall has a first thread structure to rotatably engage a second thread structure of the non-deformable pipe structure. The connect structure includes an annular bead connected to the first annular sidewall to engage an outer sidewall of the deformable pipe and flexibly deform an inner sidewall of the deformable pipe toward the non-deformable pipe structure when the first thread structure rotatably engages the second thread structure. In some embodiments, the annular bead comprises elastomeric material that may flexibly deform when engaged with the outer sidewall of the deformable pipe. In some embodiments, the housing includes a patterned surface defined about an annular exterior sidewall for manually engaging and/or rotating the housing with respect to the non-deformable pipe. Rotation of the housing with respect to the non-deformable pipe rotatably engages the first thread structure of the second annular sidewall of the housing with respect to the first thread structure of the non-deformable pipe structure.

FIG. 1 illustrates a perspective view of an implementation 100 of fluid communication in semiconductor processing equipment, according to some embodiments. In some embodiments, the implementation 100 includes a connect assembly 102 for semiconductor processing equipment, where the connect assembly 102 includes a connect structure 104 and a non-deformable pipe structure 106 to couple a deformable pipe 108 in fluid communication with a non-deformable pipe 110 of the non-deformable pipe structure 106. As illustrated in FIG. 1, the connect structure 104 is disposed around the non-deformable pipe 110 and the deformable pipe 108 is inserted around the non-deformable pipe 110 and within the connect structure 104. In some embodiments, the connect structure 104 includes a housing 112 and an annular bead 114.

According to some embodiments, the housing 112 comprises a first annular sidewall 116 to receive the deformable pipe 108 and a second annular sidewall 118 connected to the first annular sidewall 116. In some embodiments, the first annular sidewall 116 defines a first interior cavity of the housing 112 about a longitudinal axis 120 of the housing 112. In some embodiments, the second annular sidewall 118 defines a second interior cavity of the housing 112 about the longitudinal axis 120 of the housing 112. In some embodiments, the first interior cavity of the housing 112 and the second interior cavity of the housing 112 form a continuous central cavity within the housing 112 about the longitudinal axis 120 of the housing 112.

In some embodiments, the first annular sidewall 116 of the housing 112 is linear and parallel with respect to the longitudinal axis 120 of the housing 112. In some embodiments, the first annular sidewall 116 of the housing 112 is linear and tapered with respect to the longitudinal axis 120 of the housing 112. In some embodiments, the first annular sidewall 116 of the housing 112 is non-linear, such as circular, elliptical, parabolic, hyperbolic, spheroidic, conical, frustoconical, oblate, regularly curved, irregularly curved, or has another type of curvature. In some embodiments, the first annular sidewall 116 of the housing 112 is a combination of one or more linear sections and/or one or more regularly or irregularly curved sections. Other arrangements and/or configurations of the first annular sidewall 116 of the housing 112 are within the scope of the present disclosure.

In some embodiments, the second annular sidewall 118 of the housing 112 is linear and parallel with respect to the longitudinal axis 120 of the housing 112. In some embodiments, the second annular sidewall 118 of the housing 112 is linear and tapered with respect to the longitudinal axis 120 of the housing 112. In some embodiments, the second annular sidewall 118 of the housing 112 is non-linear, such as circular, elliptical, parabolic, hyperbolic, spheroidic, conical, frustoconical, oblate, regularly curved, irregularly curved, or has another type of curvature. In some embodiments, the second annular sidewall 118 of the housing 112 is a combination of one or more linear sections and/or one or more regularly or irregularly curved sections. Other arrangements and/or configurations of the second annular sidewall 118 of the housing 112 are within the scope of the present disclosure.

In some embodiments, the first annular sidewall 116 of the housing 112 is directly connected to the second annular sidewall 118 of the housing 112. In some embodiments, the first annular sidewall 116 of the housing 112 is indirectly connected to the second annular sidewall 118 of the housing 112 through one or more interior sidewalls or other structures. In some embodiments, the housing 112 comprises an interior sidewall 122 connecting the first annular sidewall 116 to the second annular sidewall 118. In some embodiments, the interior sidewall 122 of the housing 112 is linear and perpendicular with respect to the longitudinal axis 120 of the housing 112. In some embodiments, the interior sidewall 122 of the housing 112 is linear and tapered with respect to the longitudinal axis 120 of the housing 112. In some embodiments, the interior sidewall 122 of the housing 112 is non-linear, such as circular, elliptical, parabolic, hyperbolic, spheroidic, conical, frustoconical, oblate, regularly curved, irregularly curved, or has another type of curvature. In some embodiments, the interior sidewall 122 of the housing 112 is a combination of one or more linear sections and/or one or more regularly or irregularly curved sections. Other arrangements and/or configurations of the interior sidewall 122 of the housing 112 are within the scope of the present disclosure.

According to some embodiments, the housing 112 comprises an annular exterior sidewall 124, a first exterior sidewall 126, and a second exterior sidewall 128. In some embodiments, the first annular sidewall 116 is connected to the annular exterior sidewall 124 by the first exterior sidewall 126. In some embodiments, the second annular sidewall 118 is connected to the annular exterior sidewall 124 by the second exterior sidewall 128. In some embodiments, the annular exterior sidewall 124 includes a patterned surface 130. The patterned surface 130 may define indentations, grooves, ridges, protrusions and/or other patterned structures to enhance manual manipulation of the connect structure 104 with respect to the deformable pipe 108 and/or the non-deformable pipe 110. In some embodiments, the annular exterior sidewall 124 of the housing 112 is linear and perpendicular with respect to the longitudinal axis 120 of the housing 112. In some embodiments, the annular exterior sidewall 124 of the housing 112 is linear and tapered with respect to the longitudinal axis 120 of the housing 112. In some embodiments, the annular exterior sidewall 124 of the housing 112 is non-linear, such as circular, elliptical, parabolic, hyperbolic, spheroidic, conical, frustoconical, oblate, regularly curved, irregularly curved, or has another type of curvature. In some embodiments, the annular exterior sidewall 124 of the housing 112 is a combination of one or more linear sections and/or one or more regularly or irregularly curved sections. Other arrangements and/or configurations of the annular exterior sidewall 124 and/or the patterned surface 130 are within the scope of the present disclosure.

In some embodiments, the first exterior sidewall 126 of the housing 112 defines an opening of the first annular sidewall 116 to receive the deformable pipe 108 and/or the non-deformable pipe 110. In some embodiments, the opening of the first exterior sidewall 126 of the housing 112 has the same diameter as the first interior cavity of the first annular sidewall 116. In some embodiments, the opening of the first exterior sidewall 126 of the housing 112 has a greater diameter than the first interior cavity of the first annular sidewall 116. For example, the opening of the first exterior sidewall 126 of the housing 112 may be about the same diameter as a greatest outer diameter of the non-deformable pipe structure 106 to approximate a flush bearing surface with the deformable pipe 108. In this example, the first interior cavity of the first annular sidewall 116 may be greater than the opening of the first exterior sidewall 126 of the housing 112 to enhance mating of the deformable pipe 108 between the non-deformable pipe 110 and the first annular sidewall 116. In some embodiments, the first exterior sidewall 126 of the housing 112 is linear and perpendicular with respect to the longitudinal axis 120 of the housing 112. In some embodiments, the first exterior sidewall 126 of the housing 112 is linear and tapered with respect to the longitudinal axis 120 of the housing 112. In some embodiments, the first exterior sidewall 126 of the housing 112 is non-linear, such as circular, elliptical, parabolic, hyperbolic, spheroidic, conical, frustoconical, oblate, regularly curved, irregularly curved, or has another type of curvature. In some embodiments, the first exterior sidewall 126 of the housing 112 is a combination of one or more linear sections and/or one or more regularly or irregularly curved sections. Other arrangements and/or configurations of the first exterior sidewall 126 are within the scope of the present disclosure.

In some embodiments, the second exterior sidewall 128 of the housing 112 defines an opening of the second annular sidewall 118 to receive the non-deformable pipe 110. In some embodiments, the opening of the second exterior sidewall 128 of the housing 112 has the same diameter as the second interior cavity of the second annular sidewall 118. In some embodiments, the opening of the second exterior sidewall 128 of the housing 112 has a greater diameter than the second interior cavity of the second annular sidewall 118. For example, the opening of the second exterior sidewall 128 of the housing 112 may be about the same diameter as a greatest outer diameter of the non-deformable pipe 110 to approximate a flush bearing surface with the non-deformable pipe 110. In this example, the second interior cavity of the second annular sidewall 118 may be greater than the opening of the second exterior sidewall 128 of the housing 112 to enhance mating of the non-deformable pipe 110 and the second annular sidewall 118. In some embodiments, the second exterior sidewall 128 of the housing 112 is linear and perpendicular with respect to the longitudinal axis 120 of the housing 112. In some embodiments, the second exterior sidewall 128 of the housing 112 is linear and tapered with respect to the longitudinal axis 120 of the housing 112. In some embodiments, the second exterior sidewall 128 of the housing 112 is non-linear, such as circular, elliptical, parabolic, hyperbolic, spheroidic, conical, frustoconical, oblate, regularly curved, irregularly curved, or has another type of curvature. In some embodiments, the second exterior sidewall 128 of the housing 112 is a combination of one or more linear sections and/or one or more regularly or irregularly curved sections. Other arrangements and/or configurations of the second exterior sidewall 128 are within the scope of the present disclosure.

According to some embodiments, the annular bead 114 of the connect structure 104 is connected to the first annular sidewall 116 of the housing 112 with a bonding material, such as an adhesive. In some embodiments, the annular bead 114 of the connect structure 104 is seated within an annular groove (not shown) in the first annular sidewall 116 of the housing 112. In some embodiments, the annular bead 114 of the connect structure 104 is seated within the annular groove in the first annular sidewall 116 without the bonding material. In some embodiments, the annular bead 114 of the connect structure 104 is seated within the annular groove in the first annular sidewall 116 and affixed within the annular groove with the bonding material. The bonding material bonds at least some of the annular bead 114 to the first annular sidewall 116 of the housing 112.

According to some embodiments, the bonding material between the annular bead 114 of the connect structure 104 and the first annular sidewall 116 of the housing 112 may include an adhesive, such as a single component epoxy adhesive or a dual component epoxy adhesive. The bonding material may include a structural adhesive, such as a structural acrylic adhesive, an epoxy, and/or a combination of a structural adhesive and an epoxy. The bonding material may include another adhesive component, such as an anaerobic adhesive, a cyanoacrylate adhesive (e.g., methyl cyanoacrylate), or a modified structural polymer adhesive. According to some embodiments, the bonding material may be used in combination with an activator, such as an anaerobic surface activator. Other arrangements and/or configurations of the bonding material between the annular bead 114 and the first annular sidewall 116 of the housing 112 are within the scope of the present disclosure.

According to some embodiments, the annular bead 114 of the connect structure 104 is a fixing feature to provide a seal between the deformable pipe 108 and the non-deformable pipe 110. The annular bead 114 of the connect structure 104 may comprise an elastomeric material. The annular bead 114 may comprise a fluorocarbon-based fluoroelastomer material, such as fluoro-rubber (FKM), or a perfluoroelastomer material, such as perfluoroelastomer-rubber (FFKM). FKM is an ASTM International (ASTM) standard designation D1418 for a class of fluorinated, carbon-based synthetic rubber, commonly known as fluoroelastomer. FKM is also known by the fluoroelastomer category (FPM) according to the International Organization for Standardization (ISO) standard designation ISO 1629, and is also known as fluorine rubber. FKM contains vinylidene fluoride as a monomer. FKM provides heat resistance for seals in temperatures greater than 200° C. and provides resistance to high pressures, chemicals and/or other fluids. FFKM is designated by ASTM as standard 1418. FFKM materials contain a higher amount of fluorine than FKM fluoroelastomers. FFKM materials may provide resistance to plasma environments in higher service temperature conditions. FFKM materials provide resistance to contact with hydrocarbons or highly corrosive fluids, or plasmas over a range of temperatures from ambient temperature to over 320° C. According to some embodiments, the annular bead 114 of the connect structure 104 includes one or more other materials such as silicone, vinyl-methyl-silicone (VMQ), nitrile butadiene rubber (NBR), polytetrafluoroethylene (PTFE), fluorosilicone rubber (FVMQ), and/or silicone rubber. According to some embodiments, the annular bead 114 of the connect structure 104 may be changed within the connect structure 104 depending upon the type of processing, temperature, and/or pressure of fluid communicated through the connect assembly 102. Other materials and/or configurations of the annular bead 114 of the connect structure 104 are within the scope of the present disclosure.

According to some embodiments, the housing 112 is made of a metal material, such as aluminum, stainless steel, brass, copper, etc., a dielectric material, such as quartz, alumina, silicon nitride, etc., and/or other suitable materials. In some embodiments, the housing 112 is made of a polymer material, a metal material, a dielectric material, a ceramic material, a quartz material, a combination of materials and/or other suitable materials. Examples of polymer materials s include fluoropolymers, polyetherimide, polycarbonate, polyetheretherketone (PEEK), polyimide, and/or other suitable polymers. Examples of ceramic materials include alumina, ceria, yttria, zirconia, and/or other suitable ceramic materials. Examples of quartz materials include fused quartz, fused silica, quartz glass, and/or other suitable quartz materials. Other materials and/or configurations of the housing 112 are within the scope of the present disclosure.

According to some embodiments, the second annular sidewall 118 of the housing 112 defines a first thread structure 132 to rotatably engage a second thread structure 134 of the non-deformable pipe structure 106. In some embodiments, the first thread structure 132 of the second annular sidewall 118 of the housing 112 is axially parallel to the longitudinal axis 120 of the housing 112. In some embodiments, the first thread structure 132 of the second annular sidewall 118 of the housing 112 is axially tapered with respect to the longitudinal axis 120 of the housing 112. In some embodiments, the first thread structure 132 comprises a helical groove defined in the second annular sidewall 118 to rotatably engage the second thread structure 134 of the non-deformable pipe structure 106. In some embodiments, the first thread structure 132 comprises a pair of helical grooves defined in the second annular sidewall 118 to rotatably engage the second thread structure 134 of the non-deformable pipe structure 106. In some embodiments, the first thread structure 132 comprises a triplet of helical grooves defined in the second annular sidewall 118 to rotatably engage the second thread structure 134 of the non-deformable pipe structure 106. In some embodiments, the helical groove, the pair of helical grooves, or the triplet of helical grooves, or portions thereof, are recessed within the second annular sidewall 118 axially away from the longitudinal axis 120 of the housing 112. In some embodiments, the helical groove, the pair of helical grooves, or the triplet of helical grooves, or portions thereof, protrude from the second annular sidewall 118 axially toward the longitudinal axis 120 of the housing 112. In some embodiments, the first thread structure 132 comprising a coating material that rotatably engages the second thread structure 134 of the non-deformable pipe structure 106. The coating material may include a metal, a combination or mixture of metals, an adhesive, a structural adhesive, an epoxy, a combination of a structural adhesive and an epoxy, a fluorocarbon-based fluoroelastomer material, a perfluoroelastomer material, other materials, or combinations thereof. Other arrangements and/or configurations of the first thread structure 132 are within the scope of the present disclosure.

According to some embodiments, the non-deformable pipe structure 106 comprises the non-deformable pipe 110, a second annular bead 136, and a third annular bead 138. In some embodiments, the non-deformable pipe 110, the second annular bead 136, and/or the third annular bead 138 are axially symmetrical about a longitudinal axis 139 of the non-deformable pipe 110. In some embodiments, the second thread structure 134 of the non-deformable pipe 110 is axially parallel to the longitudinal axis 139 of the non-deformable pipe 110. In some embodiments, the second thread structure 134 of the non-deformable pipe 110 is axially tapered with respect to the longitudinal axis 139 of the non-deformable pipe 110.

In some embodiments, the second thread structure 134 comprises a helical groove defined in an outer sidewall 111 of the non-deformable pipe 110 to rotatably engage the first thread structure 132 of the second annular sidewall 118 of the housing 112. In some embodiments, the second thread structure 134 comprises a pair of helical grooves defined in the outer sidewall 111 of the non-deformable pipe 110 to rotatably engage the first thread structure 132 of the second annular sidewall 118 of the housing 112. In some embodiments, the second thread structure 134 comprises a triplet of helical grooves defined in the outer sidewall 111 of the non-deformable pipe 110 to rotatably engage the first thread structure 132 of the second annular sidewall 118 of the housing 112. In some embodiments, the helical groove, the pair of helical grooves, or the triplet of helical grooves, or portions thereof, of the second thread structure 134 are recessed within the outer sidewall 111 of the non-deformable pipe 110 axially toward the longitudinal axis 139 of the non-deformable pipe 110. In some embodiments, the helical groove, the pair of helical grooves, or the triplet of helical grooves, or portions thereof, of the second thread structure 134 protrude from the outer sidewall 111 of the non-deformable pipe 110 axially toward the longitudinal axis 139 of the non-deformable pipe 110. In some embodiments, the second thread structure 134 comprising a coating material that rotatably engages the first thread structure 132 of the second annular sidewall 118 of the housing 112. The coating material may include a metal, a combination or mixture of metals, an adhesive, a structural adhesive, an epoxy, a combination of a structural adhesive and an epoxy, a fluorocarbon-based fluoroelastomer material, a perfluoroelastomer material, other materials, or combinations thereof. Other arrangements and/or configurations of the second thread structure 134 are within the scope of the present disclosure.

In some embodiments, the second annular bead 136 and/or the third annular bead 138 are connected to the outer sidewall 111 of the non-deformable pipe 110. In some embodiments, the non-deformable pipe structure 106 comprises a plurality of annular beads, such as the second annular bead 136, the third annular bead 138, and one or more additional beads, set forth in greater detail herein. In some embodiments the one or more additional beads of the non-deformable pipe structure 106 may engage the deformable pipe 108 with the annular bead 114. In some embodiments the one or more additional beads of the non-deformable pipe structure 106 may engage the deformable pipe 108 with another annular bead (not shown) connected to the first annular sidewall 116. For example, a fourth annular bead and a fifth annular bead of the interior sidewall the non-deformable pipe structure 106 may engage the deformable pipe 108 about opposing sides of another annular bead connected to the first annular sidewall 116. Other arrangements and configurations of the annular beads are within the scope of the present disclosure.

In some embodiments, the outer sidewall 111 of the non-deformable pipe 110 may define the second thread structure 134 about a first portion 135 of the non-deformable pipe 110. The second annular bead 136 of the non-deformable pipe structure 106 may be connected to the outer sidewall 111 of the non-deformable pipe 110 about a second portion 137 of the non-deformable pipe 110. In some embodiments, the deformable pipe 108 may be received within the first annular sidewall 116 of the housing 112 and may surround the second portion 137 of the non-deformable pipe 110, wherein the annular bead 114 of the connect structure 104 flexibly deforms the deformable pipe 108 to contact the second annular bead 136 when the first thread structure 132 rotatably engages the second thread structure 134.

In some embodiments, the non-deformable pipe 110 may comprise a metal material. The non-deformable pipe 110 may comprise a metal material such as carbon steel, stainless steel, galvanized steel, cast steel, high-alloy austenitic stainless steel, copper, aluminum, an aluminum alloy, or other type of metal material. The non-deformable pipe 110 may include a lining material (not shown), such as PTFE, polyvinylidene fluoride (PVDF), polypropylene (PP), etc. In some embodiments, the second annular bead 136 or the third annular bead 138 may include a fluorocarbon-based fluoroelastomer material, a perfluoroelastomer material, or other elastomeric material as set forth in greater detail herein with respect to the annular bead 114. In some embodiments, the second annular bead 136 is the same material as the third annular bead 138. In some embodiments, the second annular bead 136 is a different material from the third annular bead 138. For example, the second annular bead 136 may have a greater coefficient of elasticity than the third annular bead 138 to decrease mating resistance of the non-deformable pipe structure 106 with the connect structure 104.

In some embodiments, the second annular bead 136 or the third annular bead 138 is the same material as the annular bead 114. In some embodiments, the second annular bead 136 or the third annular bead 138 is a different material from the annular bead 114. For example, the second annular bead 136 and the third annular bead 138 may be the same material and the annular bead 114 may have a greater coefficient of elasticity than the second annular bead 136 or the third annular bead 138 to decrease mating resistance of the non-deformable pipe structure 106 with the connect structure 104. Other materials and/or configurations for the non-deformable pipe 110, the second annular bead 136, or the third annular bead 138 are within the scope of the present disclosure.

According to some embodiments, the deformable pipe 108 comprises an outer sidewall 140, an inner sidewall 142, and a facing sidewall 144. In some embodiments, the outer sidewall 140 of the deformable pipe 108 and/or the inner sidewall 142 of the deformable pipe 108 are parallel to a longitudinal axis 146 of the deformable pipe 108. In some embodiments, the outer sidewall 140 of the deformable pipe 108 and/or the inner sidewall 142 of the deformable pipe 108 are non-parallel to a longitudinal axis 146 of the deformable pipe 108. In some embodiments, the facing sidewall 144 of the deformable pipe 108 connects the outer sidewall 140 of the deformable pipe 108 to the inner sidewall 142 of the deformable pipe 108. In some embodiments, the facing sidewall 144 of the deformable pipe 108 is perpendicular to the longitudinal axis 146 of the deformable pipe 108. In some embodiments, the facing sidewall 144 of the deformable pipe 108 is non-perpendicular to the longitudinal axis 146 of the deformable pipe 108. Other arrangements and/or configurations of the outer sidewall 140 of the deformable pipe 108, the inner sidewall 142 of the deformable pipe 108, and/or the facing sidewall 144 of the deformable pipe 108 are within the scope of the present disclosure.

According to some embodiments, the facing sidewall 144 of the deformable pipe 108 contacts the interior sidewall 122 of the housing 112 when the deformable pipe 108 is inserted within the first annular sidewall 116 of the housing 112. The annular bead 114 of the connect structure 104 may engage the outer sidewall 140 of the deformable pipe 108 and flexibly deform the inner sidewall 142 of the deformable pipe 108 toward the non-deformable pipe structure 106 when the first thread structure 132 of the second annular sidewall 118 of the housing 112 rotatably engages the second thread structure 134 of the non-deformable pipe 110. The annular bead 114 of the connect structure 104 may flexibly deform the inner sidewall 142 of the deformable pipe 108 to contact the second annular bead 136 of the non-deformable pipe structure 106 when the first thread structure 132 rotatably engages the second thread structure 134. The annular bead 114 of the connect structure 104 may flexibly deform the inner sidewall 142 of the deformable pipe 108 to contact the third annular bead 138 of the non-deformable pipe structure 106 when the first thread structure 132 rotatably engages the second thread structure 134.

According to some embodiments, an outer diameter of the outer sidewall 140 of the deformable pipe 108 is less than a first inner diameter of the first annular sidewall 116 of the housing 112. In some embodiments, the outer diameter of the outer sidewall 140 of the deformable pipe 108 is greater than a second inner diameter of the second annular sidewall 118 of the housing 112. In some embodiments, the first thread structure 132 of the second annular sidewall 118 has a first thread length and the second thread structure 134 of the non-deformable pipe structure 106 has a second thread length greater than the first thread length. In some embodiments, the non-deformable pipe 110 may include the outer sidewall 111 defining the second thread structure 134 about the first portion 135 of the non-deformable pipe 110. The second annular bead may be connected to the outer sidewall 111 of the non-deformable pipe 110 about the second portion 137 of the non-deformable pipe 110. The third annular bead 138 may be adjacent to the second annular bead 136 and connected to the outer sidewall 111 of the non-deformable pipe 110 about the second portion 137 of the non-deformable pipe 110. The annular bead 114 may flexibly deform the deformable pipe 108 to contact the third annular bead 138 when the first thread structure 132 rotatably engages the second thread structure 134.

According to some embodiments of the connect assembly 102, the housing 112 is retained in a first position and the non-deformable pipe is inserted within the first annular sidewall 116 and the second annular sidewall 118 of the housing 1112. The non-deformable pipe 110 may be coupled onto the deformable pipe 108 and the housing 112 may be coupled onto the deformable pipe 108 and the non-deformable pipe 110. The housing 112 may then be rotated from the first position to a second position to engage the first thread structure 132 with the second thread structure 134 and flexibly deform the deformable pipe 108 to contact the annular bead 114 and the second annular bead 136. In some embodiments, fluid may be communicated from the deformable pipe 108 into the non-deformable pipe 110, as illustrated in FIG. 1. In some embodiments, fluid may be communicated in a reverse direction from the direction illustrated in FIG. 1, e.g., from the non-deformable pipe 110 into the deformable pipe 108. Other arrangements and/or configurations of the connect assembly 102 are within the scope of the present disclosure.

Figure 2:
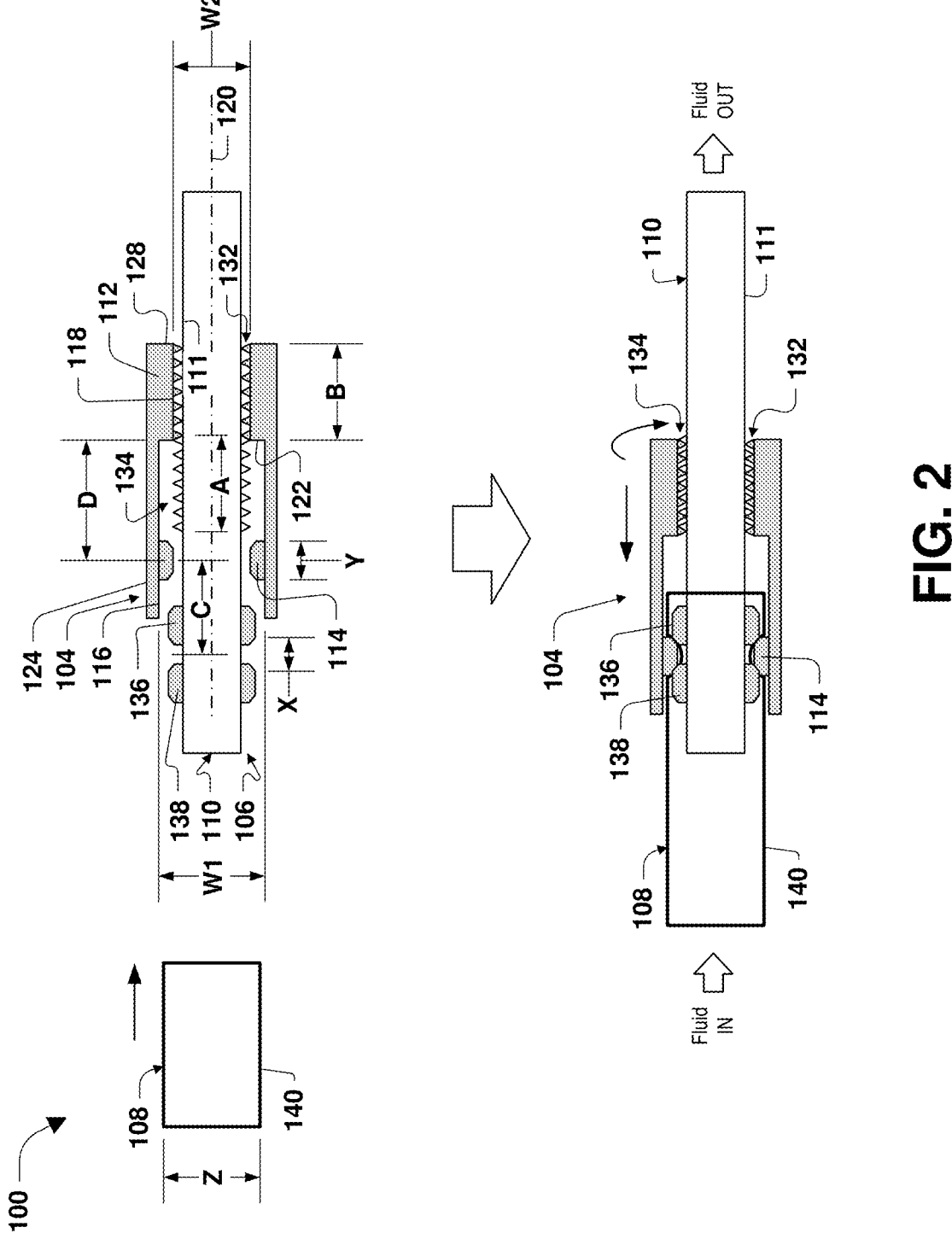
FIG. 2 illustrates a sectional view of an implementation of fluid communication in semiconductor processing equipment, according to some embodiments.

FIG. 2 illustrates a sectional view of an implementation 100 of fluid communication in semiconductor processing equipment, according to some embodiments. In some embodiments of the connect assembly 102, the first thread structure 132 of the second annular sidewall 118 has a first thread length B and the second thread structure 134 of the non-deformable pipe structure 106 has a second thread length A. In some embodiments, the first thread length B of the first thread structure 132 greater than the second thread length A of the second thread structure 134.

In some embodiments, the second annular bead 136 is separated from the third annular bead 138 by a separation distance X and the annular bead 114 has an annular bead width Y. In some embodiments, the annular bead width Y of the annular bead 114 is greater than the separation distance X between the second annular bead 136 and the third annular bead 138. In some embodiments, the first annular sidewall 116 of the housing 112 has a first inner diameter W1 and the outer sidewall 140 of the deformable pipe 108 has an outer diameter Z. In some embodiments, the first inner diameter W1 of the first annular sidewall 116 of the housing 112 is greater than the outer diameter Z of the outer sidewall 140 of the deformable pipe 108.

In some embodiments, the second annular sidewall 118 of the housing 112 has a second inner diameter W2. In some embodiments, the outer diameter Z of the outer sidewall 140 of the deformable pipe 108 is greater than the second inner diameter W2 of the second annular sidewall 118 of the housing 112. In some embodiments, the annular bead 114 is connected to the first annular sidewall 116 of the housing 112 a first sidewall distance D from the interior sidewall 122 of the housing 112 and the annular bead 114 travels a first travel distance C along the longitudinal axis 120 of the housing 112. In some embodiments, the annular bead 114 is connected to the first annular sidewall 116 the first sidewall distance D from the interior sidewall 122 and the annular bead 114 travels the first travel distance C greater than the first sidewall distance D along the longitudinal axis of the housing 112 when the first thread structure 132 rotatably engages the second thread structure 134. Other dimensions and/or configurations of the connect assembly 102 are within the scope of the present disclosure.

Figures 3A, 3B:
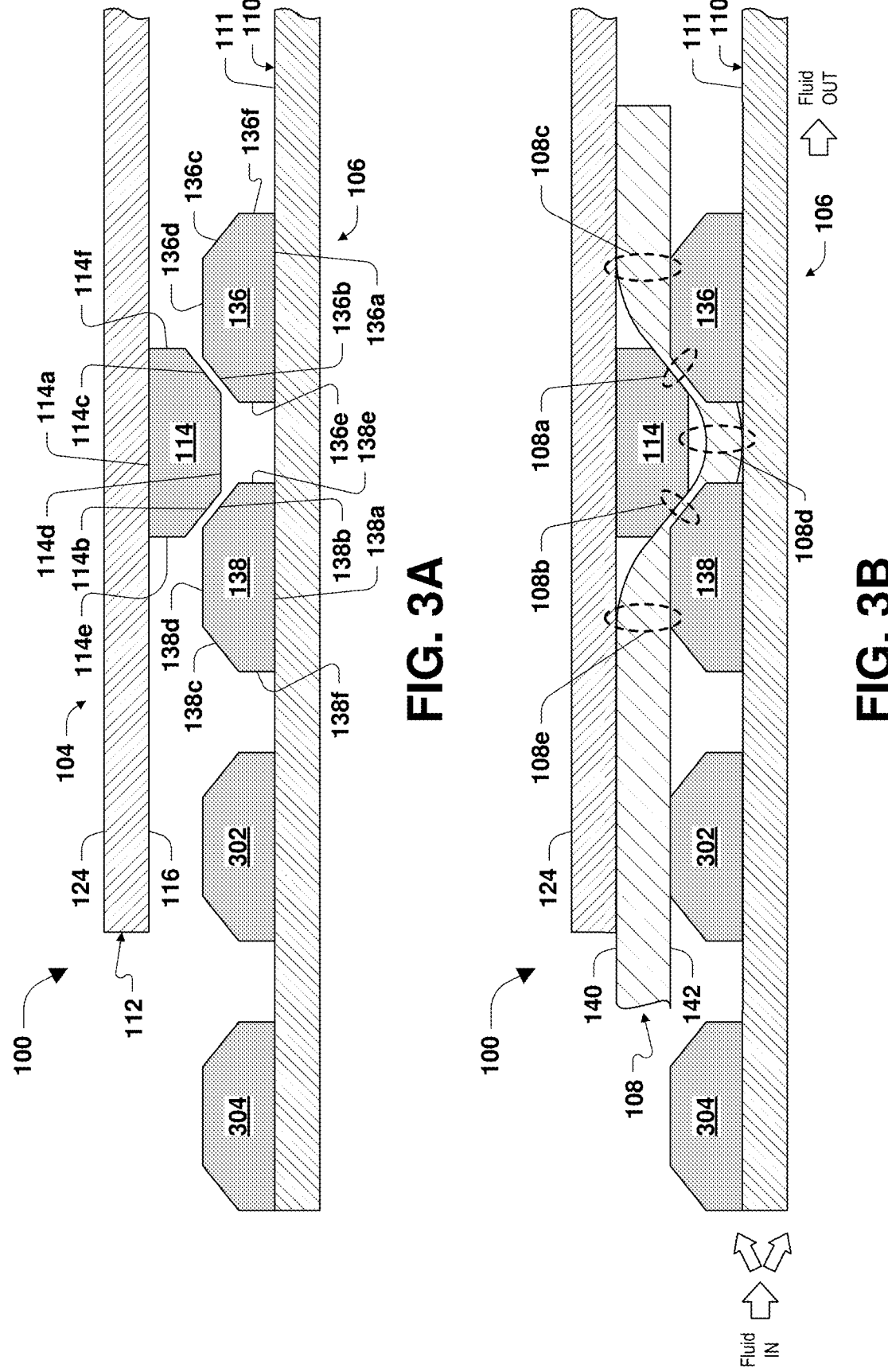
FIGS. 3A-3B illustrate sectional views of an implementation of fluid communication in semiconductor processing equipment, according to some embodiments.

FIGS. 3A-3B illustrate sectional views of an implementation 100 of fluid communication in semiconductor processing equipment, according to some embodiments. In some embodiments and as illustrated in FIG. 3A, the annular bead 114 of the connect structure 104 includes an annular bead first surface 114a, an annular bead second surface 114b connected to the annular bead first surface 114a, and an annular bead third surface 114c connected to the annular bead first surface 114a. In some embodiments, the annular bead second surface 114b is directly connected to the annular bead third surface 114c. In some embodiments, the annular bead second surface 114b is indirectly connected to the annular bead third surface 114c. For example, the annular bead second surface 114b may be connected to the annular bead third surface 114c with an annular bead fourth surface 114d. In some embodiments, the annular bead second surface 114b and/or the annular bead third surface 114c are directly connected to the annular bead first surface 114a. In some embodiments, the annular bead second surface 114b and/or the annular bead third surface 114c are indirectly connected to the annular bead first surface 114a. For example, the annular bead second surface 114b may be connected to the annular bead first surface 114a with an annular bead fifth surface 114e and the annular bead third surface may be connected to the annular bead first surface 114a with an annular bead sixth surface 114f. Other arrangements and/or configurations of the surfaces of the annular bead 114 are within the scope of the present disclosure.

According to some embodiments, the second annular bead 136 of the non-deformable pipe structure 106 includes a second annular bead first surface 136a, a second annular bead second surface 136b connected to the second annular bead first surface 136a, and a second annular bead third surface 136c connected to the second annular bead first surface 136a. In some embodiments, the second annular bead second surface 136b is directly connected to the second annular bead third surface 136c. In some embodiments, the second annular bead second surface 136b is indirectly connected to the second annular bead third surface 136c. For example, the second annular bead second surface 136b may be connected to the second annular bead third surface 136c with a second annular bead fourth surface 136d. In some embodiments, the second annular bead second surface 136b and/or the second annular bead third surface 136c are directly connected to the second annular bead first surface 136a. In some embodiments, the second annular bead second surface 136b and/or the second annular bead third surface 136c are indirectly connected to the second annular bead first surface 136a. For example, the second annular bead second surface 136b may be connected to the second annular bead first surface 136a with a second annular bead fifth surface 136e and the second annular bead third surface may be connected to the second annular bead first surface 136a with a second annular bead sixth surface 136f. Other arrangements and/or configurations of the surfaces of the second annular bead 136 are within the scope of the present disclosure.

According to some embodiments, the third annular bead 138 of the non-deformable pipe structure 106 includes a third annular bead first surface 138a, a third annular bead second surface 138b connected to the third annular bead first surface 138a, and a third annular bead third surface 138c connected to the third annular bead first surface 138a. In some embodiments, the third annular bead second surface 138b is directly connected to the third annular bead third surface 138c. In some embodiments, the third annular bead second surface 138b is indirectly connected to the third annular bead third surface 138c. For example, the third annular bead second surface 138b may be connected to the third annular bead third surface 138c with a third annular bead fourth surface 138d. In some embodiments, the third annular bead second surface 138b and/or the third annular bead third surface 138c are directly connected to the third annular bead first surface 138a. In some embodiments, the third annular bead second surface 138b and/or the third annular bead third surface 138c are indirectly connected to the third annular bead first surface 138a. For example, the third annular bead second surface 138b may be connected to the third annular bead first surface 138a with a third annular bead fifth surface 138e and the third annular bead third surface may be connected to the third annular bead first surface 138a with a third annular bead sixth surface 138f. Other arrangements and/or configurations of the surfaces of the third annular bead 138 are within the scope of the present disclosure.

In some embodiments, the annular bead first surface 114a is connected to the first annular sidewall 116 of the housing 112. The annular bead second surface 114b may be connected to and tapered away from the annular bead first surface 114a. The annular bead third surface 114c may be connected to and tapered toward the annular bead first surface 114a and connected to the annular bead second surface 114b by the annular bead fourth surface 114d non-perpendicular to the annular bead first surface 114a. In some embodiments and as illustrated in FIG. 3A, a width of the annular bead first surface 114a may be greater than a separation distance between the second annular bead 136 and the third annular bead 138. In some embodiments and as illustrated in FIG. 3A, a width of the annular bead fourth surface 114d may be greater than a separation distance between the second annular bead 136 and the third annular bead 138. Other arrangements and/or configurations of the relational distances between the annular bead 114, the second annular bead 136, and/or the third annular bead 138 are within the scope of the present disclosure.

According to some embodiments, the non-deformable pipe structure 106 includes a plurality of annular beads connected to the outer sidewall 111 of the non-deformable pipe 110. For example, the non-deformable pipe structure 106 may include a fourth annular bead 302 connected to the outer sidewall 111 of the non-deformable pipe 110 and/or a fifth annular bead 304 connected to the outer sidewall 111 of the non-deformable pipe 110. The plurality of annular beads connected to the outer sidewall 111 of the non-deformable pipe 110 may facilitate adjustment of the connect structure 104 onto various positions of the non-deformable pipe structure 106 and/or the deformable pipe 108. For example, the annular bead 114 of the housing 112 may mate with one or more of the annular beads connected to the outer sidewall 111 of the non-deformable pipe, such as the third annular bead 138 and the fourth annular bead 302, to form a seal between the non-deformable pipe 110 and the deformable pipe 108. For example, the annular bead 114 may flexibly deform the inner sidewall 142 of the deformable pipe 108 to release contact from the second annular bead 136 and contact the third annular bead 138 and the fourth annular bead 302 when the first thread structure 132 rotatably engages the second thread structure 134.

In some embodiments and as illustrated in FIG. 3B, the deformable pipe 108 includes a plurality of portions that may flexibly deform when the connect structure 104 mates the non-deformable pipe structure 106 and the deformable pipe 108. For example, the deformable pipe 108 may include a first portion 108a, a second portion 108b, a third portion 108c, a fourth portion 108d, and a fifth portion 108e, wherein one or a number of the portions may flexibly deform when the connect structure 104 mates the non-deformable pipe structure 106 and the deformable pipe 108. In some embodiments and as illustrated in FIG. 3B, the second annular bead 136 may be connected to the outer sidewall 111 of the non-deformable pipe 110 and the third annular bead 138 may be connected to the outer sidewall 111 of the non-deformable pipe 110 to flexibly deform one or a combination of the plurality of portions of the deformable pipe 108. For example, the annular bead 114 may flexibly deform the first portion 108a of the deformable pipe 108 into contact with the second annular bead 136 and the second portion 108b of the deformable pipe 108 into contact with the third annular bead 138. For example, the annular bead 114 may flexibly deform the third portion 108c of the deformable pipe 108 into contact with the second annular bead 136, the fourth portion 108d of the deformable pipe 108 into contact with the outer sidewall 111 of the non-deformable pipe 110, and the fifth portion 108e of the deformable pipe 108 into contact with the third annular bead 138. Other arrangements and/or configurations of the plurality of annular beads connected to the outer sidewall 111 of the non-deformable pipe 110 are within the scope of the present disclosure.

Figure 4:
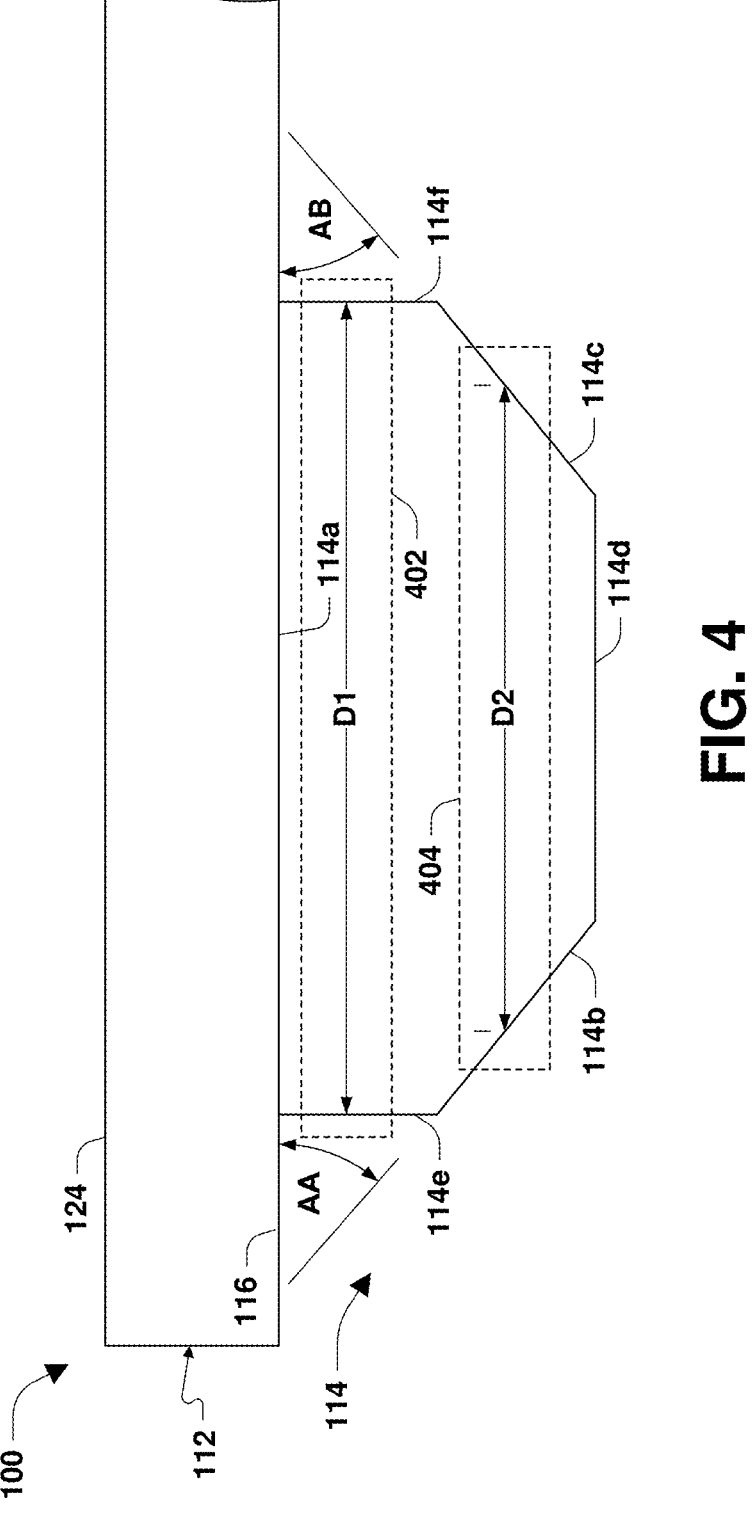
FIG. 4 illustrates a sectional view of an annular bead of a connect structure for semiconductor processing equipment, according to some embodiments.

FIG. 4 illustrates a sectional view of the annular bead 114 of the connect structure 104 for semiconductor processing equipment, according to some embodiments. In some embodiments, the annular bead second surface 114b is connected to and forms a first acute angle AA with the annular bead first surface 114a and the annular bead third surface 114c is connected to and forms a second acute angle AB with the annular bead first surface 114a. The annular bead second surface 114b and/or the annular bead third surface 114c may engage the outer sidewall 140 of the deformable pipe 108 and flexibly deform the inner sidewall 142 of the deformable pipe 108 toward the non-deformable pipe structure 106 when the first thread structure 132 rotatably engages the second thread structure 134.

In some embodiments and as illustrated in FIG. 4, annular bead 114 includes a first compression zone 402 having a first diameter D1 and a second compression zone 404 having a second diameter D2 less than the first diameter D1. The first compression zone 402 compresses toward the first annular sidewall 116 of the housing 112 with a first axial deformation and the second compression zone 404 compresses toward the first annular sidewall 116 of the housing 112 with a second axial deformation, greater than the first axial deformation, when the first thread structure 132 rotatably engages the second thread structure 134. Other arrangements and/or configurations of the annular bead 114 of the connect structure 104 are within the scope of the present disclosure.

Figure 5:
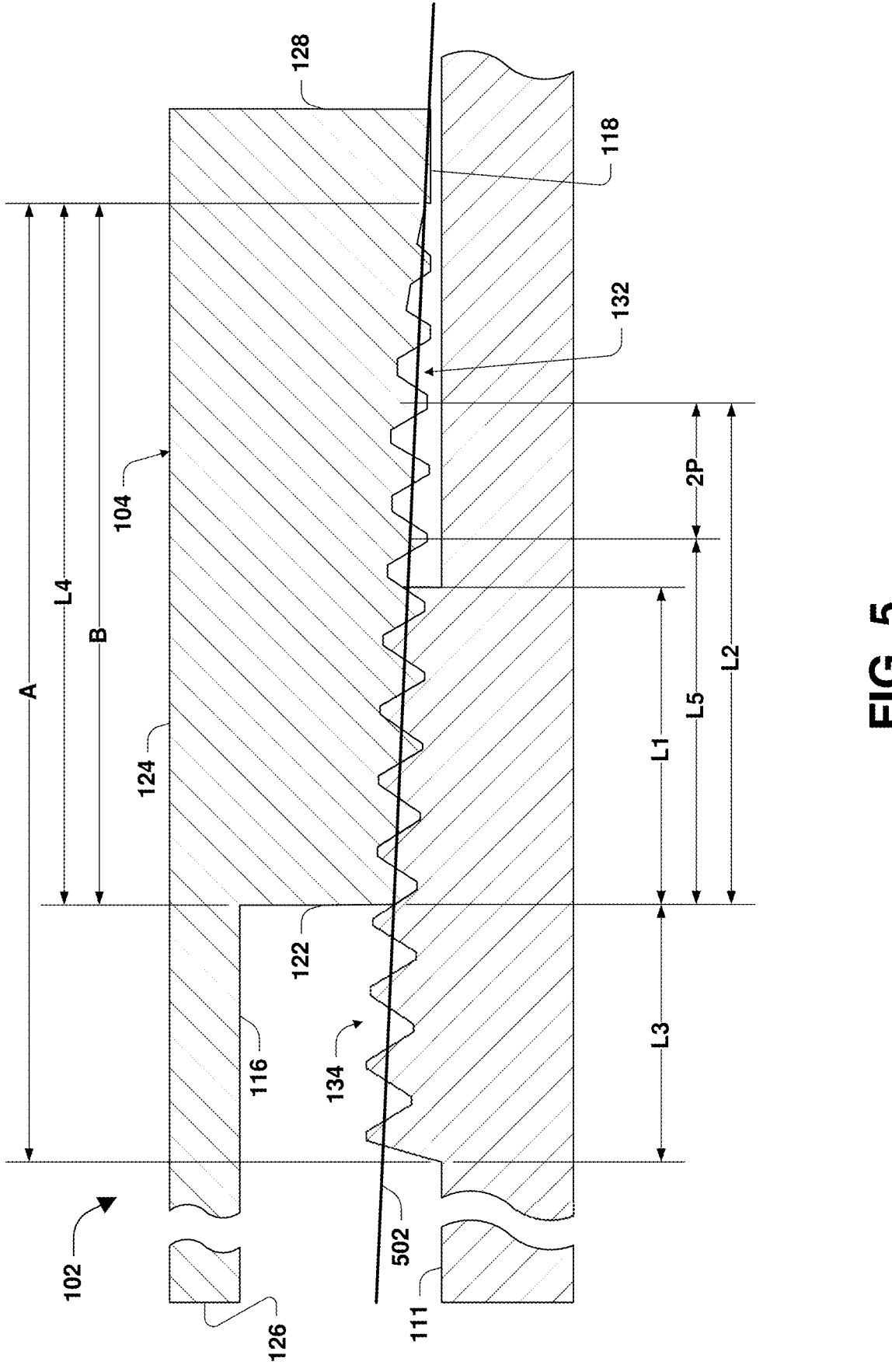
FIG. 5 illustrates a sectional view of a connect assembly for semiconductor processing equipment, according to some embodiments.

FIG. 5 illustrates a connect assembly 102 for semiconductor processing equipment, according to some embodiments. In some embodiments, the first thread structure 132 of the second annular sidewall 118 of the housing 112 and/or the second thread structure 134 of the non-deformable pipe structure 106 are tapered along a pitch line 502. In some embodiments, the pitch line 502 is tapered with respect to the longitudinal axis 120 of the housing 112 and/or the longitudinal axis 139 of the non-deformable pipe 110. In some embodiments, the second thread structure 134 has an engagement length L1, also known as a hand-tight engagement length, an effective thread length L2, a makeup length L3, and a nominal complete external thread length L5. The first thread structure 132 has an overall thread length L4, and a thread pitch P. As illustrated in FIG. 5, the thread pitch P of the first thread structure 132 is indicated as 2P, denoting twice the pitch P for clarity. In some embodiments, the first thread length B of the first thread structure 132 is equal to the overall thread length L4 of the first thread structure 132. In some embodiments, the second thread length A of the second thread structure 134 is equal to the overall thread length L4 and the makeup length L3 of the second thread structure 134.

In some embodiments, the pitch line 502 is axially parallel to the longitudinal axis 120 of the housing 112 and the longitudinal axis 139 of the non-deformable pipe 110. When the pitch line 502 is axially parallel, the first thread structure 132 of the second annular sidewall 118 of the housing 112 is axially parallel to the longitudinal axis 120 of the housing 112 and the second thread structure 134 of the non-deformable pipe 110 is axially parallel to the longitudinal axis 139 of the non-deformable pipe 110.

In some embodiments, the pitch line 502 is axially tapered toward the longitudinal axis 120 of the housing 112 and the longitudinal axis 139 of the non-deformable pipe 110, as illustrated in FIG. 5. When the pitch line 502 is axially tapered, the first thread structure 132 of the second annular sidewall 118 of the housing 112 is axially tapered toward the longitudinal axis 120 of the housing 112 and the second thread structure 134 of the non-deformable pipe 110 is axially tapered toward the longitudinal axis 139 of the non-deformable pipe 110. Other arrangements and/or configurations of the connect assembly 102 are within the scope of the present disclosure.

Figure 6:
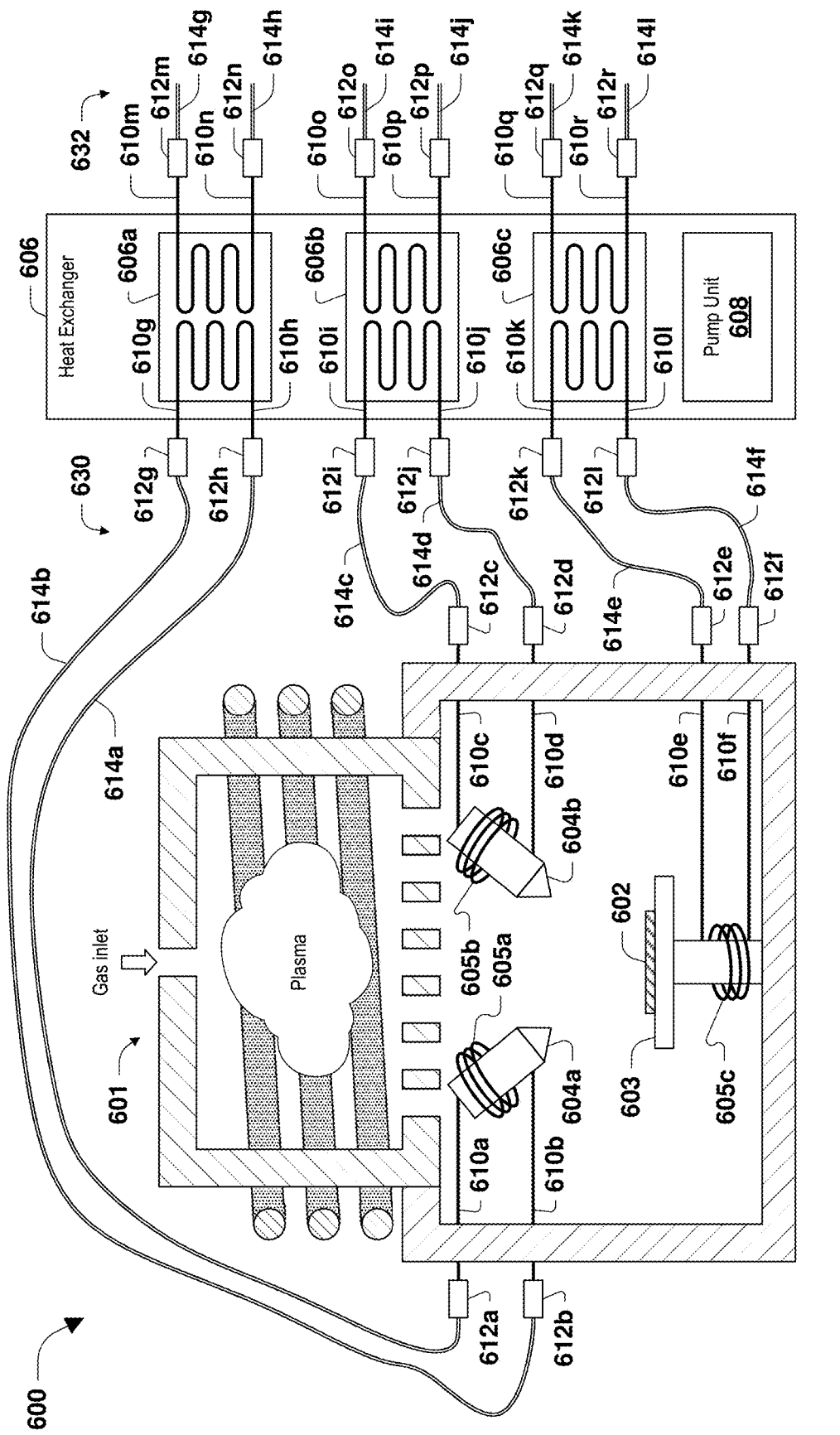
FIG. 6 illustrates a system for semiconductor processing, according to some embodiments.

FIG. 6 illustrates a system 600 for semiconductor processing, according to some embodiments. In some embodiments, the system 600 includes semiconductor processing equipment 601 for processing semiconductor wafers. According to an example, the semiconductor processing equipment 601 is shown as a CVD chamber that receives source reactive materials and carrier gas for processing a wafer 602. The wafer 602 is supported by a stage 603, and is processed by plasma that is directed from a first antenna 604*a* and a second antenna 604*b* toward the stage 603. A first cooling coil 605*a* mitigates heat from the first antenna 604*a*, a second cooling coil 605*b* mitigates heat from the second antenna 604*b*, and a third cooling coil 605*c* mitigates heat from the stage 603 and the wafer 602. A first matrix 630 of liquid cooling components transfer heat between the cooling coils of the semiconductor processing equipment 601 and a heat exchanger 606 through fluid exchange. In some embodiments, the heat exchanger 606 includes a plurality of heat exchange units to transfer heat from the first matrix 630 to a second matrix 632 of liquid cooling components. For example, the heat exchanger 606 may include a first heat exchange unit 606*a*, a second heat exchange unit 606*b*, and a third heat exchange unit 606*c* to transfer heat from the first matrix 630 to the second matrix 632.

According to some embodiments, the first matrix 630 and the second matrix 632 include a plurality of non-deformable pipes 610*a-r*, a plurality of connect assemblies 612*a-r* and a plurality of deformable pipes 614*a-f*, set forth in greater detail herein. In some embodiments, fluid within the first matrix 630 and/or the second matrix 632 may be moved through the system 600 by a pump unit 608 within the heat exchanger 606. Other arrangements and/configurations of the semiconductor processing equipment 601 for processing semiconductor wafers are within the scope of the present disclosure.

FIG. 7 illustrates a method 700, according to some embodiments. The method 700 connects a deformable pipe associated with semiconductor processing equipment to a non-deformable pipe associated with the semiconductor processing equipment. At 702, a housing is retained in a first position, the housing comprising a first annular sidewall connected to an annular bead and a second annular sidewall connected to the first annular sidewall and defining a first thread structure. For example, in FIG. 1, the housing 112 is retained in a first position. The housing comprises the first annular sidewall 116 connected to the annular bead 114. The second annular sidewall 118 is connected to the first annular sidewall 116 and defines the first thread structure 132.

At 704, a non-deformable pipe is inserted within the first annular sidewall and the second annular sidewall of the housing, the non-deformable pipe comprising an outer sidewall connected to a second annular bead and defining a second thread structure. For example, in FIG. 1, the non-deformable pipe 110 is inserted within the first annular sidewall 116 and the second annular sidewall 118 of the housing 112. The non-deformable pipe 110 comprises the outer sidewall 111 connected to the second annular bead 136 and defines the second thread structure 134.

At 706, a deformable pipe is coupled onto the non-deformable pipe. For example, as in FIG. 1, the deformable pipe 108 is coupled onto the non-deformable pipe 110.

At 708, the housing is coupled onto the deformable pipe and the non-deformable pipe. For example, as in FIG. 1, the housing 112 is coupled onto the deformable pipe 108 and the non-deformable pipe 110.

At 710, the housing is rotated from the first position to a second position to engage the first thread structure with the second thread structure and flexibly deform the deformable pipe to contact the annular bead and the second annular bead. For example, in FIG. 1, the housing 112 is rotated from the first position to a second position to engage the first thread structure 132 with the second thread structure 134 and flexibly deform the deformable pipe 108 to contact the annular bead 114 and the second annular bead 136. Other and/or additional operations of connecting a deformable pipe to a non-deformable pipe are within the scope of the present disclosure.

In some embodiments, a connect structure for semiconductor processing equipment is provided. The connect structure includes a housing configured to mate a deformable pipe associated with the semiconductor processing equipment with a non-deformable pipe structure associated with the semiconductor processing equipment. The housing includes a first annular sidewall to receive the deformable pipe and a second annular sidewall connected to the first annular sidewall. The second annular sidewall has a first thread structure to rotatably engage a second thread structure of the non-deformable pipe structure. The connect structure includes an annular bead connected to the first annular sidewall to engage an outer sidewall of the deformable pipe and flexibly deform an inner sidewall of the deformable pipe toward the non-deformable pipe structure when the first thread structure rotatably engages the second thread structure.

In some embodiments, a connect assembly for semiconductor processing equipment is provided. The connect assembly includes a housing to couple a deformable pipe to a non-deformable pipe. The housing includes a first annular sidewall and a second annular sidewall connected to the first annular sidewall. The second annular sidewall defines a first thread structure and the housing is configured to mate a deformable pipe associated with the semiconductor processing equipment with a non-deformable pipe associated with the semiconductor processing equipment. The connect assembly includes an annular bead connected to the first annular sidewall. The non-deformable pipe includes an outer sidewall defining a second thread structure about a first portion of the non-deformable pipe. A second annular bead is connected to the outer sidewall of the non-deformable pipe about a second portion of the non-deformable pipe. The deformable pipe is received within the first annular sidewall and surrounds the distal portion of the non-deformable pipe. The annular bead flexibly deforms the deformable pipe to contact the second annular bead when the first thread structure rotatably engages the second thread structure.

A method of connecting a deformable pipe associated with semiconductor processing equipment to a non-deformable pipe associated with the semiconductor processing equipment is provided. The method includes retaining a housing in a first position, the housing comprising a first annular sidewall connected to an annular bead and a second annular sidewall connected to the first annular sidewall and defining a first thread structure. The method includes inserting a non-deformable pipe within the first annular sidewall and the second annular sidewall of the housing, the non-deformable pipe comprising an outer sidewall connected to a second annular bead and defining a second thread structure. The method includes coupling a deformable pipe onto the non-deformable pipe and coupling the housing onto the deformable pipe and the non-deformable pipe. The method includes rotating the housing from the first position to a second position to engage the first thread structure with the second thread structure and flexibly deform the deformable pipe to contact the annular bead and the second annular bead.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A connect assembly for semiconductor processing equipment, comprising:
   a housing comprising a first annular sidewall and a second annular sidewall connected to the first annular sidewall, wherein:
      the second annular sidewall defines a first thread structure, and
      the housing is configured to mate a deformable pipe associated with the semiconductor processing equipment with a non-deformable pipe associated with the semiconductor processing equipment;
   a first annular bead connected to the first annular sidewall, wherein the first annular bead comprises:
      an annular bead first surface connected to the first annular sidewall of the housing;
      an annular bead second surface connected to and tapered away from the annular bead first surface; and
      an annular bead third surface connected to and tapered away from the annular bead first surface and connected to the annular bead second surface by an annular bead fourth surface non-perpendicular to the annular bead first surface;
   the non-deformable pipe comprising an outer sidewall defining a second thread structure about a first portion of the non-deformable pipe;
   a second annular bead connected to the outer sidewall of the non-deformable pipe about a second portion of the non-deformable pipe; and
   the deformable pipe received within the first annular sidewall and surrounding the second portion of the non-deformable pipe, wherein the first annular bead flexibly deforms the deformable pipe to contact the second annular bead when the first thread structure rotatably engages the second thread structure.

2. The connect assembly of claim 1, comprising a third annular bead adjacent to the second annular bead and connected to the outer sidewall of the non-deformable pipe about the second portion of the non-deformable pipe.

3. The connect assembly of claim 2, wherein a width of the annular bead first surface is greater than a separation distance between the second annular bead and the third annular bead.

4. The connect assembly of claim 3, wherein the first annular bead flexibly deforms the deformable pipe to contact the third annular bead when the first thread structure rotatably engages the second thread structure.

5. The connect assembly of claim 2, wherein the first annular bead flexibly deforms the deformable pipe to contact the third annular bead when the first thread structure rotatably engages the second thread structure.

6. The connect assembly of claim 1, wherein the housing comprises:

an interior sidewall connecting the first annular sidewall to the second annular sidewall, wherein a facing sidewall of the deformable pipe contacts the interior sidewall when the first annular bead flexibly deforms an inner sidewall of the deformable pipe to contact the second annular bead.

7. The connect assembly of claim 1, wherein:

the first thread structure of the second annular sidewall of the housing is axially parallel to a longitudinal axis of the housing, and the second thread structure of the non-deformable pipe is axially parallel to a longitudinal axis of the non-deformable pipe.

8. The connect assembly of claim 1, wherein:

the first thread structure of the second annular sidewall has a first thread length, and the second thread structure of the non-deformable pipe has a second thread length greater than the first thread length.

9. The connect assembly of claim 1, wherein the first annular bead comprises:

a first compression zone having a first diameter; and a second compression zone having a second diameter less than the first diameter.

10. The connect assembly of claim 9, wherein the first compression zone compresses toward the first annular sidewall of the housing with a first axial deformation and the second compression zone compresses toward the first annular sidewall of the housing with a second axial deformation, greater than the first axial deformation, when the first thread structure rotatably engages the second thread structure.

11. The connect assembly of claim 1, wherein:

the housing comprises an interior sidewall connecting the first annular sidewall to the second annular sidewall, the first annular bead is connected to the first annular sidewall at a first sidewall distance from the interior sidewall, and the first annular bead travels a first travel distance greater than the first sidewall distance along a longitudinal axis of the housing when the first thread structure rotatably engages the second thread structure.

12. A connect structure for semiconductor processing equipment, comprising:

a housing configured to mate a deformable pipe associated with the semiconductor processing equipment with a non-deformable pipe structure associated with the semiconductor processing equipment, the housing comprising:

a first annular sidewall to receive the deformable pipe; and a second annular sidewall connected to the first annular sidewall, wherein:

the second annular sidewall has a first thread structure to rotatably engage a second thread structure of the non-deformable pipe structure, the first thread structure of the second annular sidewall has a first thread length, the second thread structure of the non-deformable pipe structure has a second thread length greater than the first thread length, the housing comprises an interior sidewall connecting the first annular sidewall to the second annular sidewall, a first annular bead is connected to the first annular sidewall at a first sidewall distance from the interior sidewall, and the first annular bead travels a first travel distance greater than the first sidewall distance along a longitudinal axis of the housing when the first thread structure rotatably engages the second thread structure.

13. The connect structure of claim 12, wherein the first annular bead is configured to engage an outer sidewall of the deformable pipe.

14. The connect structure of claim 13, the non-deformable pipe structure comprising:

a non-deformable pipe comprising an outer sidewall; and a second annular bead connected to the outer sidewall of the non-deformable pipe, wherein the first annular bead flexibly deforms an inner sidewall of the deformable pipe to contact the second annular bead when the first thread structure rotatably engages the second thread structure.

15. The connect structure of claim 12, wherein the first annular bead comprises:

an annular bead first surface connected to the first annular sidewall of the housing; and an annular bead second surface connected to and tapered away from the annular bead first surface.

16. The connect structure of claim 15, wherein the first annular bead comprises:

an annular bead third surface connected to and tapered away from the annular bead first surface and connected to the annular bead second surface by an annular bead fourth surface non-perpendicular to the annular bead first surface.

17. A method of connecting a deformable pipe associated with semiconductor processing equipment to a non-deformable pipe associated with the semiconductor processing equipment, comprising:

retaining a housing in a first position, the housing comprising a first annular sidewall connected to a first annular bead and a second annular sidewall connected to the first annular sidewall and defining a first thread structure;

inserting the non-deformable pipe within the first annular sidewall and the second annular sidewall of the housing, the non-deformable pipe comprising an outer sidewall connected to a second annular bead and defining a second thread structure;

coupling the deformable pipe onto the non-deformable pipe;

coupling the housing onto the deformable pipe and the non-deformable pipe; and rotating the housing from the first position to a second position to engage the first thread structure with the second thread structure and flexibly deform the deformable pipe to contact the first annular bead and the second annular bead, wherein the rotation of the housing from the first position to the second position causes a first compression zone of the first annular bead to compress toward the first annular sidewall of the housing with a first axial deformation and causes a second compression zone of the first annular bead to compress toward the first annular sidewall of the housing with a second axial deformation greater than the first axial deformation.

18. The method of claim 17, wherein the rotation of the housing from the first position to the second position causes the first annular bead to travel a first travel distance along a longitudinal axis of the housing.

19. The method of claim 18, wherein:

the first annular bead is connected to the first annular sidewall at a first sidewall distance from an interior sidewall of the housing connecting the first annular sidewall to the second annular sidewall; and the first travel distance is greater than the first sidewall distance.

20. The method of claim 17, comprising:

communicating fluid from the deformable pipe into the non-deformable pipe.

\* \* \* \* \*